(12) United States Patent
Hayden et al.

(10) Patent No.: US 7,233,160 B2
(45) Date of Patent: Jun. 19, 2007

(54) WAFER PROBE

(75) Inventors: Leonard Hayden, Beaverton, OR (US); John Martin, Portland, OR (US); Mike Andrews, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 09/997,501

(22) Filed: Nov. 19, 2001

(65) Prior Publication Data

US 2002/0075019 A1 Jun. 20, 2002

Related U.S. Application Data

(60) Provisional application No. 60/251,186, filed on Dec. 4, 2000.

(51) Int. Cl.
*G01R 1/073* (2006.01)
(52) U.S. Cl. ............... 324/762; 324/754; 324/758
(58) Field of Classification Search ........... 324/754, 324/758, 762
See application file for complete search history.

(56) References Cited

U.S. PATENT DOCUMENTS

| 491,783 | A | 2/1893 | Moyer |
| 2,389,668 | A | 11/1945 | Johnson |
| 2,545,258 | A | 3/1951 | Cailloux |
| 2,762,234 | A | 9/1952 | Dodd |
| 2,901,696 | A | 8/1959 | Möllfors |
| 2,921,276 | A | 1/1960 | Fubini |
| 3,218,584 | A | 11/1965 | Ayer |
| 3,262,593 | A | 7/1966 | Hainer |
| 3,396,598 | A | 8/1968 | Grispo |
| 3,401,126 | A | 9/1968 | Miller et al. |
| 3,609,539 | A | 9/1968 | Gunthert |
| 3,429,040 | A | 2/1969 | Miller |
| 3,445,770 | A * | 5/1969 | Harmon .................. 324/762 |
| 3,561,280 | A | 2/1971 | MacPhee et al. |
| 3,573,617 | A | 4/1971 | Randolph et al. |
| 3,596,228 | A | 7/1971 | Reed et al. |
| 3,611,199 | A | 10/1971 | Safran |
| 3,619,780 | A | 11/1971 | Hocks |
| 3,622,915 | A | 11/1971 | Davo |
| 3,634,807 | A | 1/1972 | Grobe et al. |
| 3,648,169 | A | 3/1972 | Wiesler |
| 3,654,585 | A | 4/1972 | Wickersham |
| 3,622,318 | A | 5/1972 | Decuyper |
| 3,680,037 | A | 7/1972 | Nellis et al. |
| 3,686,624 | A | 8/1972 | Napoli et al. |

(Continued)

FOREIGN PATENT DOCUMENTS

DE 2951072 7/1981

(Continued)

OTHER PUBLICATIONS

Cascade Microtech, Inc.; *WPH-700 Series Multi-contact High-Speed Integrated Circuit Probes*; Apr. 30, 1991.

(Continued)

*Primary Examiner*—Ernest Karlsen
(74) *Attorney, Agent, or Firm*—Chernoff, Vilhauer, McClung & Stenzel

(57) ABSTRACT

The present invention relates to a probe for testing of integrated circuits or other microelectronic devices.

9 Claims, 3 Drawing Sheets

U.S. PATENT DOCUMENTS 3,700,998 A  10/1972  Lee et al.
3,705,379 A  12/1972  Bogar
3,725,829 A  4/1973  Brown
3,740,900 A  6/1973  Youmans et al.
3,766,470 A  10/1973  Hay et al.
3,806,801 A  4/1974  Bove
3,810,016 A * 5/1974  Chayka et al. ............... 324/762
3,829,076 A  8/1974  Sofy
3,833,852 A  9/1974  Schoch
3,839,672 A  10/1974  Anderson
3,849,728 A  11/1974  Evans
3,862,790 A  1/1975  Davies et al.
3,867,698 A * 2/1975  Beltz et al. ................. 324/762
3,930,809 A  1/1976  Evans
3,936,743 A  2/1976  Roch
3,952,156 A  4/1976  Lahr
3,971,610 A  7/1976  Buchoff et al.
3,992,073 A  11/1976  Buchoff et al.
4,001,685 A  1/1977  Roch
4,008,900 A  2/1977  Khoshaba
4,009,456 A  2/1977  Hopfer
4,027,935 A  6/1977  Byrnes et al.
4,035,723 A  7/1977  Kvaternik
4,038,599 A  7/1977  Bove et al.
4,038,894 A  8/1977  Knibbe et al.
4,049,252 A  9/1977  Bell
4,063,195 A  12/1977  Abrams et al.
4,066,943 A  1/1978  Roch
4,074,201 A  2/1978  Lennon
4,116,523 A  9/1978  Coberly et al.
4,123,706 A  10/1978  Roch
4,124,787 A  11/1978  Aamoth et al.
4,151,465 A  4/1979  Lenz
4,161,692 A  7/1979  Tarzwell
4,177,421 A  12/1979  Thornburg
4,184,133 A  1/1980  Gehle
4,184,729 A  1/1980  Parks et al.
4,216,467 A  8/1980  Colston
4,225,819 A  9/1980  Grau et al.
4,232,398 A  11/1980  Gould et al.
4,251,772 A  2/1981  Worsham et al.
4,280,112 A  7/1981  Eisenhart
4,284,033 A  8/1981  del Rio
4,287,473 A  9/1981  Sawyer
4,302,146 A  11/1981  Finlayson et al.
4,306,235 A  12/1981  Christmann
4,312,117 A  1/1982  Robillard et al.
4,340,860 A  7/1982  Teeple, Jr.
4,346,355 A  8/1982  Tsukii
4,375,631 A  3/1983  Goldberg
4,520,314 A  5/1985  Asch et al.
4,541,222 A  9/1985  Joly
4,563,640 A * 1/1986  Hasegawa ................... 324/762
4,593,243 A  6/1986  Lao et al.
4,641,659 A  2/1987  Sepponen
4,646,005 A  2/1987  Ryan
4,649,339 A  3/1987  Grangroth et al.
4,652,082 A  3/1987  Warner
4,663,840 A  5/1987  Ubbens et al.
4,669,805 A  6/1987  Kosugi et al.
4,673,839 A  6/1987  Veenendaal
4,684,883 A  8/1987  Ackerman et al.
4,684,884 A  8/1987  Soderlund
4,685,150 A  8/1987  Maier
4,696,544 A  9/1987  Costella
4,697,143 A  9/1987  Lockwood et al.
4,705,447 A  11/1987  Smith
4,706,050 A  11/1987  Andrews
4,707,657 A  11/1987  Boegh-Petersen
4,714,873 A  12/1987  McPherson et al.
4,727,319 A  2/1988  Shahriary
4,727,391 A  2/1988  Tajima et al.
4,727,637 A  3/1988  Buckwitz et al.
4,734,641 A  3/1988  Byrd, Jr. et al.
4,739,259 A  4/1988  Hadwin et al.
4,740,764 A  4/1988  Gerlack
4,746,857 A  5/1988  Sakai et al.
4,749,942 A  6/1988  Sang et al.
4,755,742 A  7/1988  Mallory et al.
4,755,872 A  7/1988  Esrig et al.
4,757,255 A  7/1988  Margozzi
4,764,723 A  8/1988  Strid
4,772,846 A  9/1988  Reeds
4,780,670 A * 10/1988  Cherry ....................... 324/754
4,783,625 A  11/1988  Harry et al.
4,788,851 A  12/1988  Brault
4,791,363 A  12/1988  Logan
4,793,814 A  12/1988  Zifcak et al.
4,795,962 A  1/1989  Yanagawa et al.
4,805,627 A  2/1989  Klingenbeck et al.
4,810,981 A  3/1989  Herstein
4,818,059 A  4/1989  Kakii et al.
4,827,211 A  5/1989  Strid et al.
4,835,495 A  5/1989  Simonutti
4,837,507 A  6/1989  Hechtman
4,849,689 A  7/1989  Gleason et al.
4,853,624 A  8/1989  Rabjohn
4,853,627 A  8/1989  Gleason et al.
4,858,160 A  8/1989  Strid et al.
4,864,227 A  9/1989  Sato
4,871,964 A  10/1989  Boll et al.
4,888,550 A  12/1989  Reid
4,891,584 A  1/1990  Kamieniecki et al.
4,893,914 A  1/1990  Hancock et al.
4,894,612 A  1/1990  Drake et al.
4,899,126 A  2/1990  Yamada
4,899,998 A  2/1990  Teramachi
4,901,012 A  2/1990  Gloanec et al.
4,904,933 A  2/1990  Snyder et al.
4,906,920 A  3/1990  Huff et al.
4,908,570 A  3/1990  Gupta et al.
4,912,399 A  3/1990  Greub et al.
4,916,002 A  4/1990  Carver
4,918,373 A  4/1990  Newberg
4,918,383 A  4/1990  Huff et al.
4,922,186 A  5/1990  Tsuchiya et al.
4,922,912 A  5/1990  Watanabe
4,926,172 A  5/1990  Gorsek
4,970,386 A  11/1990  Buck
4,972,073 A  11/1990  Lessing
4,975,638 A  12/1990  Evans et al.
4,980,637 A  12/1990  Huff et al.
4,983,910 A  1/1991  Majidi-Ahy et al.
4,987,100 A  1/1991  McBride et al.
4,988,062 A  1/1991  London
4,991,290 A  2/1991  MacKay
4,998,062 A  3/1991  Ikeda
4,998,063 A  3/1991  Miller
5,001,423 A  3/1991  Abrami et al.
5,003,253 A  3/1991  Majidi-Ahy et al.
5,020,219 A  6/1991  Leedy
5,021,186 A  6/1991  Ota et al.
5,030,907 A  7/1991  Yih et al.
5,045,781 A  9/1991  Gleason et al.
5,059,898 A  10/1991  Barsotti et al.
5,061,192 A  10/1991  Chapin et al.
5,062,628 A  11/1991  Heyn et al.
5,089,774 A  2/1992  Nakano
5,091,692 A  2/1992  Ohno et al.
5,097,101 A  3/1992  Trobough
5,097,207 A  3/1992  Blanz
5,101,453 A  3/1992  Rumbaugh
5,116,180 A  5/1992  Fung et al.
5,126,286 A  6/1992  Chance

| Patent No. | Date | Inventor |
|---|---|---|
| 5,126,696 A | 6/1992 | Grote et al. |
| 5,133,119 A | 7/1992 | Afshari et al. |
| 5,134,365 A | 7/1992 | Okubo et al. |
| 5,136,237 A | 8/1992 | Smith et al. |
| 5,138,289 A | 8/1992 | McGrath |
| 5,145,552 A | 9/1992 | Yoshizawa et al. |
| 5,148,131 A | 9/1992 | Amboss et al. |
| 5,159,264 A | 10/1992 | Anderson |
| 5,159,267 A | 10/1992 | Anderson |
| 5,159,752 A | 11/1992 | Mahant-Shetti et al. |
| 5,172,050 A | 12/1992 | Swapp |
| 5,172,051 A | 12/1992 | Zamborelli |
| 5,177,438 A | 1/1993 | Littlebury et al. |
| 5,180,977 A | 1/1993 | Huff |
| 5,202,558 A | 4/1993 | Barker |
| 5,202,648 A | 4/1993 | McCandless |
| 5,207,585 A | 5/1993 | Byrnes et al. |
| 5,225,037 A | 7/1993 | Elder et al. |
| 5,232,789 A | 8/1993 | Platz et al. |
| 5,233,197 A | 8/1993 | Bowman et al. |
| 5,266,963 A | 11/1993 | Carter |
| 5,267,088 A | 11/1993 | Nomura |
| 5,270,664 A | 12/1993 | McMurtry et al. |
| 5,274,336 A | 12/1993 | Crook et al. |
| 5,289,117 A | 2/1994 | Van Loan et al. |
| 5,293,175 A | 3/1994 | Hemmie et al. |
| 5,298,972 A | 3/1994 | Heffner |
| 5,313,157 A | 5/1994 | Pasiecznik, Jr. |
| 5,315,237 A | 5/1994 | Iwakura et al. |
| 5,316,435 A | 5/1994 | Mozingo |
| 5,317,656 A | 5/1994 | Moslehi et al. |
| 5,321,352 A | 6/1994 | Takebuchi |
| 5,321,453 A | 6/1994 | Mori et al. |
| 5,326,412 A | 7/1994 | Schreiber et al. |
| 5,334,931 A | 8/1994 | Clarke et al. |
| 5,335,079 A | 8/1994 | Yuen et al. |
| 5,347,204 A | 9/1994 | Gregory et al. |
| 5,360,312 A | 11/1994 | Mozingo |
| 5,361,049 A | 11/1994 | Rubin et al. |
| 5,367,165 A | 11/1994 | Toda et al. |
| 5,371,654 A | 12/1994 | Beaman et al. |
| 5,373,231 A | 12/1994 | Boll et al. |
| 5,376,790 A | 12/1994 | Linker et al. |
| 5,383,787 A | 1/1995 | Switky et al. |
| 5,389,885 A | 2/1995 | Swart |
| 5,395,353 A | 3/1995 | Scribner |
| 5,404,111 A | 4/1995 | Mori et al. |
| 5,408,189 A | 4/1995 | Swart et al. |
| 5,412,330 A | 5/1995 | Ravel et al. |
| 5,412,866 A | 5/1995 | Woith et al. |
| 5,414,565 A | 5/1995 | Sullivan et al. |
| 5,430,813 A | 7/1995 | Anderson et al. |
| 5,441,690 A | 8/1995 | Ayala-Esquilin et al. |
| 5,453,404 A | 9/1995 | Leedy |
| 5,463,324 A | 10/1995 | Wardwell et al. |
| 5,467,024 A | 11/1995 | Swapp |
| 5,475,316 A | 12/1995 | Hurley et al. |
| 5,476,211 A | 12/1995 | Khandros |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,487,999 A | 1/1996 | Farnworth |
| 5,493,236 A | 2/1996 | Ishii et al. |
| 5,505,150 A | 4/1996 | James et al. |
| 5,506,515 A | 4/1996 | Godshalk et al. |
| 5,507,652 A | 4/1996 | Wardwell |
| 5,517,126 A | 5/1996 | Yamaguchi |
| 5,521,518 A | 5/1996 | Higgins |
| 5,521,522 A | 5/1996 | Abe et al. |
| 5,523,694 A | 6/1996 | Cole, Jr. |
| 5,527,372 A | 6/1996 | Voisine et al. |
| 5,530,372 A | 6/1996 | Lee et al. |
| 5,531,022 A | 7/1996 | Beaman et al. |
| 5,532,608 A | 7/1996 | Behfar-Rad et al. |
| 5,550,481 A | 8/1996 | Holmes et al. |
| 5,565,788 A | 10/1996 | Burr et al. |
| 5,571,324 A | 11/1996 | Sago et al. |
| 5,578,932 A | 11/1996 | Adamian |
| 5,584,120 A | 12/1996 | Roberts |
| 5,589,781 A | 12/1996 | Higgins et al. |
| 5,594,358 A | 1/1997 | Ishikawa et al. |
| 5,601,740 A | 2/1997 | Eldridge et al. |
| 5,610,529 A | 3/1997 | Schwindt |
| 5,611,008 A | 3/1997 | Yap |
| 5,612,816 A | 3/1997 | Strahle et al. |
| 5,617,035 A | 4/1997 | Swapp |
| 5,621,333 A * | 4/1997 | Long et al. .................. 324/762 |
| 5,621,400 A | 4/1997 | Corbi |
| 5,623,213 A | 4/1997 | Liu et al. |
| 5,623,214 A | 4/1997 | Pasiecznik, Jr. |
| 5,627,473 A | 5/1997 | Takani |
| 5,633,780 A | 5/1997 | Cronin |
| 5,635,846 A | 6/1997 | Beaman et al. |
| 5,642,298 A | 6/1997 | Mallory et al. |
| 5,644,248 A | 7/1997 | Fujimoto |
| 5,656,942 A | 8/1997 | Watts et al. |
| 5,659,421 A | 8/1997 | Rahmel et al. |
| 5,666,063 A | 9/1997 | Abercrombie et al. |
| 5,669,316 A | 9/1997 | Faz et al. |
| 5,670,888 A | 9/1997 | Cheng |
| 5,675,499 A | 10/1997 | Lee et al. |
| 5,676,360 A | 10/1997 | Boucher et al. |
| 5,685,232 A | 11/1997 | Inoue |
| 5,686,317 A | 11/1997 | Akram et al. |
| 5,688,618 A | 11/1997 | Hulderman et al. |
| 5,700,844 A | 12/1997 | Hedrick et al. |
| 5,704,355 A | 1/1998 | Bridges |
| 5,715,819 A | 2/1998 | Svenson et al. |
| 5,720,098 A | 2/1998 | Kister |
| 5,723,347 A | 3/1998 | Kirano et al. |
| 5,726,211 A | 3/1998 | Hedrick et al. |
| 5,728,091 A | 3/1998 | Payne et al. |
| 5,729,150 A | 3/1998 | Schwindt |
| 5,731,920 A | 3/1998 | Katsuragawa |
| 5,742,174 A | 4/1998 | Kister et al. |
| 5,748,506 A | 5/1998 | Bockelman |
| 5,756,021 A | 5/1998 | Hedrick et al. |
| 5,756,908 A | 5/1998 | Knollmeyer et al. |
| 5,767,690 A | 6/1998 | Fujimoto |
| 5,772,451 A | 6/1998 | Dozier, II et al. |
| 5,773,780 A | 6/1998 | Eldridge et al. |
| 5,777,485 A | 7/1998 | Tanaka et al. |
| 5,785,538 A | 7/1998 | Beaman et al. |
| 5,794,133 A | 8/1998 | Kashima |
| 5,803,607 A | 9/1998 | Jones et al. |
| 5,804,483 A | 9/1998 | Nakajima et al. |
| 5,804,607 A | 9/1998 | Hedrick et al. |
| 5,804,982 A | 9/1998 | Lo et al. |
| 5,806,181 A | 9/1998 | Khandros et al. |
| 5,810,607 A | 9/1998 | Shih et al. |
| 5,811,751 A | 9/1998 | Leong et al. |
| 5,811,982 A | 9/1998 | Beaman et al. |
| 5,813,847 A | 9/1998 | Eroglu et al. |
| 5,814,847 A | 9/1998 | Shihadeh et al. |
| 5,820,014 A | 10/1998 | Dozier, II et al. |
| 5,821,763 A | 10/1998 | Beaman et al. |
| 5,829,128 A | 11/1998 | Eldridge et al. |
| 5,829,437 A | 11/1998 | Bridges |
| 5,831,442 A | 11/1998 | Heigl |
| 5,832,601 A | 11/1998 | Eldridge et al. |
| 5,838,160 A | 11/1998 | Beaman et al. |
| 5,841,288 A | 11/1998 | Meaney et al. |
| 5,841,342 A | 11/1998 | Hegmann et al. |
| 5,852,871 A | 12/1998 | Khandros |
| 5,864,946 A | 2/1999 | Eldridge et al. |

| Patent | Date | Inventors | Patent | Date | Inventors |
|---|---|---|---|---|---|
| 5,869,974 A | 2/1999 | Akram et al. | 6,172,337 B1 | 1/2001 | Johnsgard et al. |
| 5,876,082 A | 3/1999 | Kempf et al. | 6,174,744 B1 | 1/2001 | Watanabe et al. |
| 5,878,486 A | 3/1999 | Eldridge et al. | 6,175,228 B1 | 1/2001 | Zamborelli et al. |
| 5,883,522 A | 3/1999 | O'Boyle | 6,181,144 B1 | 1/2001 | Hembree et al. |
| 5,884,398 A | 3/1999 | Eldridge et al. | 6,181,149 B1 | 1/2001 | Godfrey et al. |
| 5,892,539 A | 4/1999 | Colvin | 6,181,416 B1 | 1/2001 | Falk |
| 5,896,038 A | 4/1999 | Budnaitis et al. | 6,184,053 B1 | 2/2001 | Eldridge et al. |
| 5,897,289 A | 4/1999 | Yarush et al. | 6,184,587 B1 | 2/2001 | Khandros et al. |
| 5,900,737 A | 5/1999 | Graham et al. | 6,191,596 B1 | 2/2001 | Abiko |
| 5,900,738 A | 5/1999 | Khandros et al. | 6,206,273 B1 | 3/2001 | Beaman et al. |
| 5,905,421 A | 5/1999 | Oldfield | 6,208,225 B1 | 3/2001 | Miller |
| 5,912,046 A | 6/1999 | Eldridge et al. | 6,211,663 B1 | 4/2001 | Moulthrop et al. |
| 5,914,613 A | 6/1999 | Gleason et al. | 6,215,196 B1 | 4/2001 | Eldridge et al. |
| 5,914,614 A | 6/1999 | Beaman et al. | 6,215,295 B1 | 4/2001 | Smith, III |
| 5,917,707 A | 6/1999 | Khandros et al. | 6,215,670 B1 | 4/2001 | Khandros |
| 5,923,180 A | 7/1999 | Botka et al. | 6,218,910 B1 | 4/2001 | Miller |
| 5,926,029 A | 7/1999 | Ference et al. | 6,222,031 B1 | 4/2001 | Wakabayashi et al. |
| 5,926,951 A | 7/1999 | Khandros et al. | 6,222,970 B1 | 4/2001 | Wach et al. |
| 5,944,093 A | 8/1999 | Viswanath | 6,229,327 B1 | 5/2001 | Boll et al. |
| 5,945,836 A | 8/1999 | Sayre et al. | 6,232,149 B1 | 5/2001 | Dozier, II et al. |
| 5,959,461 A | 9/1999 | Brown et al. | 6,232,787 B1 | 5/2001 | Lo et al. |
| 5,963,364 A | 10/1999 | Leong et al. | 6,232,789 B1 | 5/2001 | Schwindt |
| 5,970,429 A | 10/1999 | Martin | 6,233,613 B1 | 5/2001 | Walker et al. |
| 5,973,504 A | 10/1999 | Chong | 6,242,803 B1 | 6/2001 | Khandros et al. |
| 5,974,662 A | 11/1999 | Eldridge et al. | 6,246,247 B1 | 6/2001 | Eldridge et al. |
| 5,982,166 A | 11/1999 | Mautz | 6,255,126 B1 | 7/2001 | Mathieu et al. |
| 5,983,493 A | 11/1999 | Eldridge et al. | 6,256,882 B1 | 7/2001 | Gleason et al. |
| 5,994,152 A | 11/1999 | Khandros et al. | 6,257,565 B1 | 7/2001 | Avneri et al. |
| 5,998,228 A | 12/1999 | Eldridge et al. | 6,268,015 B1 | 7/2001 | Mathieu et al. |
| 5,998,864 A | 12/1999 | Khandros et al. | 6,268,016 B1 | 7/2001 | Bhatt et al. |
| 5,999,268 A | 12/1999 | Yonezawa et al. | 6,271,673 B1 | 8/2001 | Furuta et al. |
| 6,002,426 A | 12/1999 | Back et al. | 6,274,823 B1 | 8/2001 | Khandros et al. |
| 6,006,002 A | 12/1999 | Motoki et al. | 6,275,043 B1 | 8/2001 | Muhlberger et al. |
| 6,023,103 A | 2/2000 | Chang et al. | 6,275,738 B1 | 8/2001 | Kasevich et al. |
| 6,029,344 A | 2/2000 | Khandros et al. | 6,278,051 B1 | 8/2001 | Peabody |
| 6,031,384 A | 2/2000 | Streib et al. | 6,281,691 B1 | 8/2001 | Matsunaga et al. |
| 6,032,356 A | 3/2000 | Eldridge et al. | 6,286,208 B1 | 9/2001 | Shih et al. |
| 6,033,935 A | 3/2000 | Dozier, II et al. | 6,295,729 B1 | 10/2001 | Beaman et al. |
| 6,034,533 A | 3/2000 | Tervo et al. | 6,300,775 B1 | 10/2001 | Peach et al. |
| 6,040,739 A | 3/2000 | Wedeen et al. | 6,300,780 B1 | 10/2001 | Beaman et al. |
| 6,042,712 A | 3/2000 | Mathieu | 6,307,161 B1 | 10/2001 | Grube et al. |
| 6,043,563 A | 3/2000 | Eldridge et al. | 6,307,363 B1 | 10/2001 | Anderson |
| 6,046,599 A | 4/2000 | Long et al. | 6,307,672 B1 | 10/2001 | DeNure |
| 6,049,216 A | 4/2000 | Yang et al. | 6,310,483 B1 | 10/2001 | Taura et al. |
| 6,049,976 A | 4/2000 | Khandros | 6,320,372 B1 | 11/2001 | Keller |
| 6,050,829 A | 4/2000 | Eldridge et al. | 6,320,396 B1 | 11/2001 | Nikawa |
| 6,052,653 A | 4/2000 | Mazur et al. | 6,327,034 B1 | 12/2001 | Hoover et al. |
| 6,054,651 A | 4/2000 | Fogel et al. | 6,329,827 B1 | 12/2001 | Beaman et al. |
| 6,059,982 A | 5/2000 | Palagonia et al. | 6,330,164 B1 | 12/2001 | Khandros et al. |
| 6,060,888 A | 5/2000 | Blackham et al. | 6,332,270 B2 | 12/2001 | Beaman et al. |
| 6,061,589 A | 5/2000 | Bridges et al. | 6,334,247 B1 | 1/2002 | Beaman et al. |
| 6,062,879 A | 5/2000 | Beaman et al. | 6,339,338 B1 | 1/2002 | Eldridge et al. |
| 6,064,213 A | 5/2000 | Khandros et al. | 6,340,895 B1 | 1/2002 | Uher et al. |
| 6,064,217 A | 5/2000 | Smith | 6,351,885 B2 | 3/2002 | Suzuki et al. |
| 6,064,218 A | 5/2000 | Godfrey et al. | 6,352,454 B1 | 3/2002 | Kim et al. |
| 6,071,009 A | 6/2000 | Clyne | 6,384,614 B1 | 5/2002 | Hager et al. |
| 6,078,183 A | 6/2000 | Cole, Jr. | 6,384,615 B2 | 5/2002 | Schwindt |
| 6,078,500 A | 6/2000 | Beaman et al. | 6,396,296 B1 | 5/2002 | Tarter et al. |
| 6,090,261 A | 7/2000 | Mathieu | 6,396,298 B1 | 5/2002 | Young et al. |
| 6,091,256 A | 7/2000 | Long et al. | 6,400,168 B2 | 6/2002 | Matsunaga et al. |
| 6,096,561 A | 8/2000 | Kaplan et al. | 6,404,213 B2 | 6/2002 | Noda |
| 6,104,201 A | 8/2000 | Beaman et al. | 6,407,562 B1 | 6/2002 | Whiteman |
| 6,104,206 A | 8/2000 | Verkuil | 6,415,858 B1 | 7/2002 | Getchel et al. |
| 6,110,823 A | 8/2000 | Eldridge et al. | 6,429,029 B1 | 8/2002 | Eldridge et al. |
| 6,114,864 A | 9/2000 | Soejima et al. | 6,441,315 B1 | 8/2002 | Eldridge et al. |
| 6,118,287 A | 9/2000 | Boll et al. | 6,442,831 B1 | 9/2002 | Khandros et al. |
| 6,118,894 A | 9/2000 | Schwartz et al. | 6,448,788 B1 | 9/2002 | Meaney et al. |
| 6,124,725 A | 9/2000 | Sato | 6,448,865 B1 | 9/2002 | Miller |
| 6,127,831 A | 10/2000 | Khoury et al. | 6,452,406 B1 | 9/2002 | Beaman et al. |
| 6,130,536 A | 10/2000 | Powell et al. | 6,452,411 B1 | 9/2002 | Miller et al. |
| 6,150,186 A | 11/2000 | Chen et al. | 6,456,099 B1 | 9/2002 | Eldridge et al. |
| 6,168,974 B1 | 1/2001 | Chang et al. | 6,456,103 B1 | 9/2002 | Eldridge et al. |
| 6,169,410 B1 | 1/2001 | Grace et al. | 6,459,343 B1 | 10/2002 | Miller |

| | | | | | | |
|---|---|---|---|---|---|---|
| 6,459,739 B1 | 10/2002 | Vitenberg | | 6,708,403 B2 | 3/2004 | Beaman et al. |
| 6,468,098 B1 | 10/2002 | Eldridge | | 6,710,265 B2 | 3/2004 | Hill et al. |
| 6,475,822 B2 | 11/2002 | Eldridge | | 6,710,798 B1 | 3/2004 | Hershel et al. |
| 6,476,333 B1 | 11/2002 | Khandros et al. | | 6,713,374 B2 | 3/2004 | Eldridge et al. |
| 6,476,630 B1 | 11/2002 | Whitten et al. | | 6,714,828 B2 | 3/2004 | Eldridge et al. |
| 6,479,308 B1 | 11/2002 | Eldridge | | 6,717,426 B2 | 4/2004 | Iwasaki |
| 6,480,978 B1 | 11/2002 | Roy et al. | | 6,720,501 B1 | 4/2004 | Henson |
| 6,481,939 B1 | 11/2002 | Gillespie et al. | | 6,722,032 B2 | 4/2004 | Beaman et al. |
| 6,482,013 B2 | 11/2002 | Eldridge et al. | | 6,724,205 B1 | 4/2004 | Hayden et al. |
| 6,483,327 B1 | 11/2002 | Bruce et al. | | 6,724,928 B1 | 4/2004 | Davis |
| 6,488,405 B1 | 12/2002 | Eppes et al. | | 6,727,579 B1 | 4/2004 | Eldridge et al. |
| 6,490,471 B2 | 12/2002 | Svenson et al. | | 6,727,580 B1 | 4/2004 | Eldridge et al. |
| 6,491,968 B1 | 12/2002 | Mathieu et al. | | 6,727,716 B1 | 4/2004 | Sharif |
| 6,496,024 B2 | 12/2002 | Schwindt | | 6,729,019 B2 | 5/2004 | Grube et al. |
| 6,499,121 B1 | 12/2002 | Roy et al. | | 6,734,687 B1 | 5/2004 | Ishitani et al. |
| 6,501,343 B2 | 12/2002 | Miller | | 6,741,085 B1 | 5/2004 | Khandros et al. |
| 6,509,751 B1 | 1/2003 | Mathieu et al. | | 6,741,092 B2 | 5/2004 | Eldridge et al. |
| 6,520,778 B1 | 2/2003 | Eldridge et al. | | 6,744,268 B2 | 6/2004 | Hollman |
| 6,525,555 B1 | 2/2003 | Khandros et al. | | 6,753,679 B1 | 6/2004 | Kwong et al. |
| 6,526,655 B2 | 3/2003 | Beaman et al. | | 6,759,311 B2 | 7/2004 | Eldridge et al. |
| 6,528,984 B2 | 3/2003 | Beaman et al. | | 6,764,869 B2 | 7/2004 | Eldridge |
| 6,528,993 B1 | 3/2003 | Shin et al. | | 6,771,806 B1 | 8/2004 | Satya et al. |
| 6,529,844 B1 | 3/2003 | Kapetanic et al. | | 6,777,319 B2 | 8/2004 | Grube et al. |
| 6,534,856 B1 | 3/2003 | Dozier, II et al. | | 6,778,406 B2 | 8/2004 | Eldridge et al. |
| 6,538,214 B2 | 3/2003 | Khandros | | 6,780,001 B2 | 8/2004 | Eldridge et al. |
| 6,538,538 B2 | 3/2003 | Hreish et al. | | 6,784,674 B2 | 8/2004 | Miller |
| 6,539,531 B2 | 3/2003 | Miller et al. | | 6,784,677 B2 | 8/2004 | Miller |
| 6,549,022 B1 | 4/2003 | Cole, Jr. et al. | | 6,784,679 B2 | 8/2004 | Sweet et al. |
| 6,549,106 B2 | 4/2003 | Martin | | 6,788,093 B2 | 9/2004 | Aitren et al. |
| 6,551,884 B2 | 4/2003 | Masuoka | | 6,788,094 B2 | 9/2004 | Khandros et al. |
| 6,559,671 B2 | 5/2003 | Miller et al. | | 6,791,176 B2 | 9/2004 | Mathieu et al. |
| 6,572,608 B1 | 6/2003 | Lee et al. | | 6,798,225 B2 | 9/2004 | Miller |
| 6,573,702 B2 | 6/2003 | Marcuse et al. | | 6,798,226 B2 | 9/2004 | Altmann et al. |
| 6,597,187 B2 | 7/2003 | Eldridge et al. | | 6,806,724 B2 | 10/2004 | Hayden et al. |
| 6,603,323 B1 | 8/2003 | Miller et al. | | 6,807,734 B2 | 10/2004 | Eldridge et al. |
| 6,603,324 B2 | 8/2003 | Eldridge et al. | | 6,811,406 B2 | 11/2004 | Grube |
| 6,605,941 B2 | 8/2003 | Abe | | 6,812,691 B2 | 11/2004 | Miller |
| 6,605,951 B1 | 8/2003 | Cowan | | 6,815,963 B2 | 11/2004 | Gleason et al. |
| 6,606,014 B2 | 8/2003 | Miller | | 6,816,031 B1 | 11/2004 | Miller |
| 6,606,575 B2 | 8/2003 | Miller | | 6,816,840 B1 | 11/2004 | Goodwin, III |
| 6,608,494 B1 | 8/2003 | Bruce et al. | | 6,817,052 B2 | 11/2004 | Grube |
| 6,611,417 B2 | 8/2003 | Chen | | 6,818,840 B2 | 11/2004 | Khandros |
| 6,615,485 B2 | 9/2003 | Eldridge et al. | | 6,822,529 B2 | 11/2004 | Miller |
| 6,616,966 B2 | 9/2003 | Mathieu et al. | | 6,825,052 B2 | 11/2004 | Eldridge et al. |
| 6,617,866 B1 | 9/2003 | Ickes | | 6,825,422 B2 | 11/2004 | Eldridge et al. |
| 6,621,082 B2 | 9/2003 | Morita et al. | | 6,827,582 B2 | 12/2004 | Mathieu et al. |
| 6,621,260 B2 | 9/2003 | Eldridge et al. | | 6,835,898 B2 | 12/2004 | Eldridge et al. |
| 6,622,103 B1 | 9/2003 | Miller | | 6,836,962 B2 | 1/2005 | Khandros et al. |
| 6,624,648 B2 | 9/2003 | Eldridge et al. | | 6,838,885 B2 | 1/2005 | Kamitani |
| 6,627,483 B2 | 9/2003 | Ondricek et al. | | 6,838,893 B2 | 1/2005 | Khandros, Jr. et al. |
| 6,627,980 B2 | 9/2003 | Eldridge | | 6,839,964 B2 | 1/2005 | Henson |
| 6,628,503 B2 | 9/2003 | Sogard | | 6,845,491 B2 | 1/2005 | Miller et al. |
| 6,633,174 B1 | 10/2003 | Satya et al. | | 6,850,082 B2 | 2/2005 | Schwindt |
| 6,640,415 B2 | 11/2003 | Eslamy et al. | | 6,856,150 B2 | 2/2005 | Sporck et al. |
| 6,640,432 B1 | 11/2003 | Mathieu et al. | | 6,862,727 B2 | 3/2005 | Stevens |
| 6,642,625 B2 | 11/2003 | Dozier, II et al. | | 6,864,105 B2 | 3/2005 | Grube et al. |
| 6,643,597 B1 | 11/2003 | Dunsmore | | 6,864,694 B2 | 3/2005 | McTigue |
| 6,644,982 B1 | 11/2003 | Ondricek et al. | | 6,870,381 B2 | 3/2005 | Grube |
| 6,646,520 B2 | 11/2003 | Miller | | 6,882,239 B2 | 4/2005 | Miller |
| 6,655,023 B1 | 12/2003 | Eldridge et al. | | 6,882,546 B2 | 4/2005 | Miller |
| 6,657,455 B2 | 12/2003 | Eldridge et al. | | 6,887,723 B1 | 5/2005 | Ondricek et al. |
| 6,661,316 B2 | 12/2003 | Hreish et al. | | 6,888,362 B2 | 5/2005 | Eldridge et al. |
| 6,664,628 B2 | 12/2003 | Khandros et al. | | 6,891,385 B2 | 5/2005 | Miller |
| 6,669,489 B1 | 12/2003 | Dozier, II et al. | | 6,900,647 B2 | 5/2005 | Yoshida et al. |
| 6,672,875 B1 | 1/2004 | Mathieu et al. | | 6,900,652 B2 | 5/2005 | Mazur |
| 6,677,744 B1 | 1/2004 | Long | | 6,900,653 B2 | 5/2005 | Yu et al. |
| 6,678,850 B2 | 1/2004 | Roy et al. | | 6,902,416 B2 | 6/2005 | Feldman |
| 6,678,876 B2 | 1/2004 | Stevens et al. | | 6,902,941 B2 | 6/2005 | Sun |
| 6,680,659 B2 | 1/2004 | Miller | | 6,903,563 B2 | 6/2005 | Yoshida et al. |
| 6,685,817 B1 | 2/2004 | Mathieu | | 6,906,506 B1 | 6/2005 | Reano et al. |
| 6,686,754 B2 | 2/2004 | Miller | | 6,906,539 B2 | 6/2005 | Wilson et al. |
| 6,690,185 B1 | 2/2004 | Khandros et al. | | 6,906,542 B2 | 6/2005 | Sakagawa et al. |
| 6,701,612 B2 | 3/2004 | Khandros et al. | | 6,906,543 B2 | 6/2005 | Lou et al. |

| Patent No. | Date | Inventor |
|---|---|---|
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,427 B2 | 7/2005 | Gifford et al. |
| 6,914,430 B2 | 7/2005 | Hasegawa et al. |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijyo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,375 B2 | 9/2005 | Hattori et al. |
| 6,946,860 B2 | 9/2005 | Cheng et al. |
| 6,948,391 B2 | 9/2005 | Brassell et al. |
| 6,948,981 B2 | 9/2005 | Pade |
| 2001/0002794 A1 | 6/2001 | Draving et al. |
| 2001/0009061 A1 | 7/2001 | Gleason et al. |
| 2001/0024116 A1 | 9/2001 | Draving |
| 2001/0030549 A1 | 10/2001 | Gleason et al. |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0070745 A1 | 6/2002 | Johnson et al. |
| 2002/0079911 A1 | 6/2002 | Schwindt et al. |
| 2002/0118034 A1 | 8/2002 | Laureanti |
| 2002/0180466 A1 | 12/2002 | Hiramatsu et al. |
| 2003/0010877 A1 | 1/2003 | Landreville et al. |
| 2003/0030822 A1 | 2/2003 | Finarov |
| 2003/0088180 A1 | 5/2003 | Van Veen et al. |
| 2003/0139662 A1 | 7/2003 | Seidman |
| 2003/0139790 A1 | 7/2003 | Ingle te al. |
| 2003/0184332 A1 | 10/2003 | Tomimatsu et al. |
| 2004/0021475 A1 | 2/2004 | Ito et al. |
| 2004/0061514 A1 | 4/2004 | Schwindt et al. |
| 2004/0066181 A1 | 4/2004 | Theis |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0113640 A1 | 6/2004 | Cooper et al. |
| 2004/0134899 A1 | 7/2004 | Hiramatsu et al. |
| 2004/0162689 A1 | 8/2004 | Jamneala et al. |
| 2004/0193382 A1 | 9/2004 | Adamian et al. |
| 2004/0199350 A1 | 10/2004 | Blackham et al. |
| 2004/0201388 A1 | 10/2004 | Barr |
| 2004/0207072 A1 | 10/2004 | Hiramatsu et al. |
| 2004/0207424 A1 | 10/2004 | Hollman |
| 2004/0246004 A1 | 12/2004 | Heuermann |
| 2004/0251922 A1 | 12/2004 | Martens et al. |
| 2005/0030047 A1 | 2/2005 | Adamian |
| 2005/0062533 A1 | 3/2005 | Vice |

FOREIGN PATENT DOCUMENTS

| | | |
|---|---|---|
| DE | 3426565 | 1/1986 |
| DE | 3637549 | 5/1988 |
| DE | 288234 | 3/1991 |
| DE | 4223658 | 1/1993 |
| DE | 9313420 | 10/1993 |
| DE | 19542955 | 5/1997 |
| DE | 19618717 | 1/1998 |
| DE | 19749687 | 5/1998 |
| DE | 29809568 | 10/1998 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 00270422 | 6/1988 |
| EP | 0 259 183 A2 | 9/1988 |
| EP | 0333521 | 9/1989 |
| EP | 0460911 | 12/1991 |
| EP | 0846476 | 6/1998 |
| EP | 0945736 | 9/1999 |
| GB | 579665 | 8/1946 |
| GB | 2014315 | 8/1979 |
| GB | 2179458 | 3/1987 |
| JP | 52-19046 | 2/1977 |
| JP | 53037077 | 4/1978 |
| JP | 55115383 | 9/1980 |
| JP | 5691503 | 7/1981 |
| JP | 56088333 | 7/1981 |
| JP | 57075480 | 5/1982 |
| JP | 57163035 | 10/1982 |
| JP | 57171805 | 10/1982 |
| JP | 58-130602 | 8/1983 |
| JP | 59 4189 | 1/1984 |
| JP | 594189 U | 1/1984 |
| JP | 60-5462 | 4/1984 |
| JP | 605462 | 4/1984 |
| JP | 61142802 | 6/1986 |
| JP | 62098634 | 5/1987 |
| JP | 62107937 | 5/1987 |
| JP | 01209380 | 8/1987 |
| JP | 62239050 | 10/1987 |
| JP | 62295374 | 12/1987 |
| JP | 1-209380 | 8/1989 |
| JP | 2124469 | 5/1990 |
| JP | 02124469 | 5/1990 |
| JP | 02135804 | 5/1990 |
| JP | 3196206 | 8/1991 |
| JP | 03228348 | 10/1991 |
| JP | 04130639 | 5/1992 |
| JP | 04159043 | 6/1992 |
| JP | 04206930 | 7/1992 |
| JP | 05082631 | 4/1993 |
| JP | 5157790 | 6/1993 |

| | | |
|---|---|---|
| JP | 5166893 | 7/1993 |
| JP | 6154238 | 6/1994 |
| JP | 7005078 | 1/1995 |
| JP | 7012871 | 1/1995 |
| JP | 8035987 | 2/1996 |
| JP | 08330401 | 12/1996 |
| JP | 09127432 | 5/1997 |
| JP | 10116866 | 5/1998 |
| JP | 11004001 | 1/1999 |
| JP | 11023975 | 1/1999 |
| JP | 2002243502 | 8/2002 |
| SU | 1195402 | 11/1985 |
| SU | 1327023 | 7/1987 |
| WO | WO1980/00101 | 1/1980 |
| WO | WO1994/10554 | 5/1994 |
| WO | WO1998/07040 | 2/1998 |
| WO | WO2001/07207 | 2/2001 |

OTHER PUBLICATIONS

Cascade Microtech, Inc.; *Special Purpose Probe 40/80 Gb/s High Performance Quadrant.*, Prior to Nov. 19, 2000.
Cascade Microtech, Inc.; Application Note, Layout rules for WPH-900 series probes., (month unavialable) 1996.
Maury Microwave Corp.; Transistor Test Fixture (TTF) Software, Software Application Packs, Sep. 20, 1982.
Maury Microwave Corp.; Transistor Test Fixture (TTF) Universal; MT 950 Series, Oct. 1982.
Maury Microwave Corp., Transistor Test Fixture (TTF) Universal; MT 950 Series, May 1985.
Inter-Continental Microwave; Microwave Semiconductor Chip Measurements using HP 8510B Tri-Calibration Technique. Prior to Nov. 19, 2000.
Design Technique; Microstrip Microwave Test Fixtures, (month unavailable) 1986.
Design Technique; Adjustable Test Fixtures, (month unavailable) 1988.
Microwave Journal, Microwave Products, Sep. 1988, p. 297.
Inter-continental Microwave,Product Catalogue. prior to Nov. 19, 2000.
Japanese Utility Model Registation, Early Disclosure No. 59-4189, *High Frequency Coaxial Connector,* Chernoff Vilhauer MrClung & Stenzel, Portland, OR; Jan. 11, 1984.
Cascade Microtech, Introducing 0.1 percent MIC vector measurement; Apr. 1989.
Qingqing Liang, et al, "Accurate ac Transistor Characterization to 110 GHz Using a New Four-port Self-Calibrated Extraction Technique," 2004 Topical Meeting on Silicon Monolithic Integrated Circuits in RF Systems, pp. 282-285, month unavailable, 2004.
Francesc Purroy and LLUIS Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.
Cohn, S, "Properties of Ridge Wave Guide," Proceedings of the I.R.E., Aug. 1947, pp. 783-788.
Cohn, Seymour B., "Optimum Desing of Stepped Transmission-Line Transformers," I.R. e. Transactions—Microwave Theory and Techniques, No. 3, Apr.1955, pp. 16-21.
Hopper, Samuel, "The Design of Ridged Waveguides," I.R.E. Transactions—Microwave Theory and techniques, No. 5, Oct. 1955, pp. 20-29.
Chen, Tsung-Shan, "Calculation of Parameters of Ridge Waveguides," IRE Transactions on Microwave Theory and Techniques, Jan. 1957, pp. 12-17.
IRE 20.1 Committe Personnel, "IRE Standards on Methods of Measuring Noise in Linear Twoports, 1959," Proc. IRE, vol. 48, pp. 60-68, Jan. 1960, pp. 32-40.
Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.
Lane, Richard Q., "The Determination of Device Noise Parameters," Proc. IEEE, vol. 57, Aug. 1969, pp. 1461-1462.
Adamian, Vaheh, et al., "A Novel Procedure for Receiver Noise Characterization," IEEE Transactions on Instrumentation and Measurement, Jun. 1973.
Daly, P., "Polar Geometry Waveguides by finite-elements Methods," IEEE Transactions on Microwave Theory and Technique, vol. MTT-22, No. 3, Mar. 1974, pp. 202-209.
Fink, Donald G., et al., "Electronics Engineers' Handbook," Sec. 17-52 Measurement and Control Circuits, month unavailable, 1975, pp. 17-22-17-27.
Bry, A., et al, "Bypass Capacitor for Chip Probe," IBM Technical Disclosure Bulletin, vol. 18, No. 11, Apr. 1976.
Skobern, J.R., "Subminiature High-Frequency Probe," IBM Technical disclosure Bulletin, vol. 19, No. 10, Mar. 1977.
Berg, William, et al., "Elastomers solve tough problems in high-frequency systems," 2119 EDN vol. 23, Jan. 5, 1978, pp. 36-42.
Eisenhart, R.L., "A Better Microstrip Connector," 1978 IEEE MTT-S International Microwave Symposium Digest, Jun. 27-29, 1978 Ottawa, Canada.
Gommlich, Hans, et al., "Verzerrungsmessungen-Wichtige Aufgabe in der Ubertragungstechnik," Elektronik 8/Apr. 23, 1982, pp. 110-119.
Larock, V., et al., "Automatic Noise Temperature Meaurement Through Frequency Variation," IEEE Transactions on Microwave Theory and Techniques, vol. MTT-30, No. 8, Aug. 1982, pp. 1286-1288.
Maury Microwave Corp.,"Transistor Test Fixture (TTF) Inserts, Calibration & Check Devices, MT951, MT952, MT953 Series," Advanced Data 4T-002, Sep. 20, 1982, pp. 1-2.
Maury Microwave Corp., "Transistor Test Fixture (TTF)," MT950 Series, Advanced data 4T-001, Oct. 7, 1982.
Abbott, D.A., et al., "Automatic noise figure measurements with computer contol and coreection," 8054 Radio and Electronic Engineer vol. 52, Oct. 1982, pp. 468-474.
Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.
Adamian, V. et al., "Simplified Noise Evaluation of Microwave Receiver," IEEE Transactions on Instrumentation and Measurement, vol. IM-33, No. 2, Jun. 1984, 136-140.
Pastori, William E., "High accuracy microwave noise figure measurements," 8029 Electronic Engineering 56, No. 695, 1984, pp. 181-189.
Inter-Continental Microwave, "Product Catalog," VMC 1055 Jan. 1986.
Design Technique, "Microstrip Microwave Test Fixture," May 1986.
Cascade Microtech, Inc., "Wide Probe Assembly," Full Scale Drawing, May 29, 1986, 2 pages.
Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.
Sharma, A., "Tunable Waveguide-to-Microstrip Transition for Millimeter-Wave Appplications," IEE MTT-S Digest month unavialable, 1987.
Izadian, Jamal S., "Unified Design Plans Aid Waveguide Transitions," Microwaves & R&F, May 1987, pp. 213-222.
Mazilu, T., "a Self-Ajusting Waveguide-to-MIcrostrip Transition," MIcrowave Journal, Jul. 1987, pp. 133-134.
Carlton, D.E. et al., "Accurate Measurement of High-speed Package and Interconnect Parasitics," IEEE 1988 Custom Integrated Circuits Conference, pp. 23.31-23.3.6, month unavailable, 1988.
Fraser, Artur, et al., "GHz On-Silicon-Wafer Probing Calibration Methods," Paper 7.6, IEEE 1988 Bipolor Circuits & Technology Meeting, pp. 154-157, month unavailable, 1988.

Modolo, John A., et al, "Wafer level high-frequency measurements of photodetector characteristics," Applied Optics, vol. 27 pp. 3059-3061, Aug. 1988.

Design Technique, "Adjustable Test Fixture," month unavailable, 1988.

Tong, Peter R., et al., "Noise Measurements at MM-Wave Frequencies," 176 Microwave Journal Jul. 31, 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectanular Waveguide to Coplaner Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," Apr. 1991, 700S-591.

Liu, S.M. Joseph, et al., "a New Probe for W-band On-wafer Measurements," IEEE MTT-S Digest, month unavailable, 1993, pp. 1335-1338.

Photo of Micromanipulator Probe Station, month unavailable, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, month unavailable, 1996.

Cascade Microtech, "Air coplanar Probe Series," month unavailable 1997.

Yong-Dae, Kim , et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss availabel,"Cascade Microtech, Inc., Air coplanar Probe Series, month unavailable, 2000.

Cascade Microtech, "On-Wafer Test Solutions for State-of-the-Art Electro-Optical Components,"month unavailable 2001.

Purroy. F. et al., "New Theoretica Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/plD/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285, month unavailbable 2004.

Basu, S., et al, "A Membrane Quandrant Probe for R&D Applications," Cascade Microtech, Inc. At Least one year prior to filing., date unavailable.

Electrical Operation, Calibration and Measurement Steps with the HP 8510, At least one year prior to filing, date unavailable.

Whinnery, J.R. et al., "Equivalent Circuits for Discontinuities in Transmission Lines," Proceedings of IRE, at least one year prior to filing., Feb., 1944.

Inter-Continental Microwave, Application Note: 101, Microwave Semiconductor Chip Measurements using the HP 8510B TRL-Calibration Technique, at least one year prior to filing., date unavailable.

Cascade Microtech, "Special Purpose Probe 40/80 Gb/s High Performance Quandrant," at least one year prior to filing., date unavailable.

Agilent Technology Product Information, HPW281D Waveguide Adapter, 1 mm (m) to W-Band, 75 GHz to 110 GHz., date unavailable.

Cascade Microwave, "Introducing the World's First Microwave Wafer Probing Equipment," 4 pages, month unavailable, 1983.

Malm, R.L. "Reduction of Stray Fields About SEM Samples," IBM Technical Disclosure Bulletin, vol. 21, No. 7, Dec. 1878 2 pages.

Kuhn, Nick, "Accurate and Automatic Noise Figure Meaurements with Standard Equipment," Hewlett-Packard Co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

* cited by examiner

WAFER PROBE

This application claims the benefit of U.S. Provisional Patent Application Ser. No. 60/251,186, filed on Dec. 4, 2000.

BACKGROUND OF THE INVENTION

The present invention relates to a probe for testing of integrated circuits or other microelectronic devices.

One type of probe utilizes a spaced-apart array of slender needles to contact pads on a device under test (DUT). A signal is provided to the DUT, and the voltages and/or currents at the selected nodes are routed to measurement equipment. A problem encountered with such measurement systems, particularly at high frequencies, is that the close proximity between the needle tips creates inductance that can interfere with accurate measurements. Though this inductance can be reduced by limiting the isolated portion of the probe tips to the region immediately surrounding the DUT, practical considerations make such a design difficult.

Probe structures have been developed to compensate for the inductance at the probe tips. One such design is exemplified by Lockwood et al., U.S. Pat. No. 4,697,143. Lockwood et al. disclose a ground-signal-ground arrangement of strip like conductive traces formed on the underside of an alumina substrate so as to create coplanar transmission lines. These coplanar transmission lines extend from the pads of the DUT at one end to a coaxial cable at the other end. The associated pair of ground traces on each coplanar transmission line is connected to the outer conductor of the coaxial cable and the interposed signal trace is connected to the inner conductor. Areas of wear-resistant conductive material are provided to reliably establish an electrical connection with the respective pads of the DUT. Layers of ferrite-containing microwave absorbing material are mounted about the substrate to absorb spurious microwave energy over a major portion of the length of each ground-signal-ground trace pattern. In accordance with this type of construction, a high frequency impedance (e.g., 50 ohms) can be presented at the probe tips to the device under test. Thus broadband signals of eighteen gigahertz or less can travel with little loss across the coplanar transmission lines formed by each ground-signal-ground trace pattern.

The probing system of Lockwood et al., however, is insufficient to effectively probe non-planar surfaces. Such surfaces might result, for example, if the pads of the DUT differ in height, if a loose metallic particle of minute dimension adheres electrostatically to the surface of one of the pads of the DUT so as to form a non-planar surface irregularity, or when the plane of the DUT is inadvertently tilted slightly with respect to the plane of the coplanar tips of the probing assembly. Further, proper alignment between the needles and the DUT requires careful placement of each needle, a time consuming process.

The alignment limitation between the needles was addressed by Godshalk, U.S. Pat. No. 5,506,515. Godshalk discloses a ground-signal-ground finger arrangement attached to a coaxial cable, as in Lockwood. The fingers, however, are originally formed in one piece, joined together by a carrier tab at the contact ends. Once the fingers are attached to the coaxial cable, the carrier tab is severed and the contact fingers appropriately shaped for contact with the DUT. Godshalk discloses that the relative position of each finger is held in alignment first by the carrying tab, and then by the coaxial cable. Unfortunately, Godshalk's design is limited in that the close placement of a coaxial cable to the finely spaced geometry of the DUT places a limit on the number of coaxial cables, and hence contact fingers, that may be used effectively in the probe. Further, a probe having multiple adjacent coaxial cables, each of which has different flexibilities, may lead to insufficient contact with some of the nodes on the DUT.

Another class of probes that provide clean power to circuits at low impedance are generally referred to as power bypass probes. Another configuration that has been developed to counteract the inductance at the tips of a probe assembly is a power bypass quadrant. The power bypass quadrant minimizes such inductance by providing integrated capacitors or resistor-capacitor networks within the probe.

Strid, U.S. Pat. No. 4,764,723, discloses a power bypass quadrant probe that utilizes an array of ceramic fingers coated with a thin gold or polyimide film to make contact with the DUT. The test signals are routed through a power bypass structure consisting of an RC network. Because of the small geometries near the DUT, the capacitors are located far away from the probe tip, which potentially decreases performance. In addition, the ceramic contact fingers tend to break during probing, particularly when the probe overshoots the contact pads. Further, probing pads that are not coplanar is exceedingly difficult because the ceramic contacting fingers lack flexibility.

Boll et al., U.S. Pat. No. 5,373,231 disclose a probe that includes an array of blades to contact the pads of a DUT. The array of blades extend from a transmission line network traced on a circuit board. An RC network is provided on the circuit board to provide the requisite power bypass, and in some instances, flexible capacitors are located close to, or between the contact blades. Because of the limited geometries near the DUT, the capacitance of the capacitors interconnected between the blades are small, and alone are insufficient to adequately eliminate circuit inductance. Accordingly, a second bank of capacitors with larger values are located away from the probe tip where space is available. Probes utilizing flexible capacitors between the closely spaced blades of the probe have proven to be of limited mechanical durability.

What is desired, therefore, is a configurable, multi-contact probe for high frequency testing of integrated circuits or other microelectronic devices that reduces the inductance at the probe tip to levels acceptable for measurement over a wide range of frequencies. The probe should be sufficiently durable and flexible to reliably and repeatedly probe substantially non-planar devices over time. It is further desired that the probe be easily aligned with the contact points on the device to be tested and that the probe be capable of simultaneously probing a number of such contact points.

DETAILED DESCRIPTION OF THE PREFERRED EMBODIMENT

Figure 1:
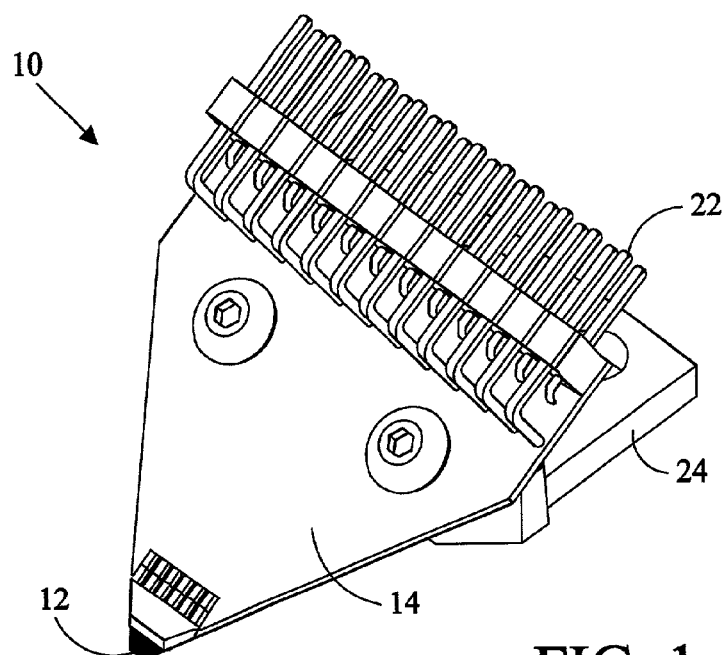
FIG. 1 shows a top view of an exemplary embodiment of the probe head of the present invention.
Figure 2:
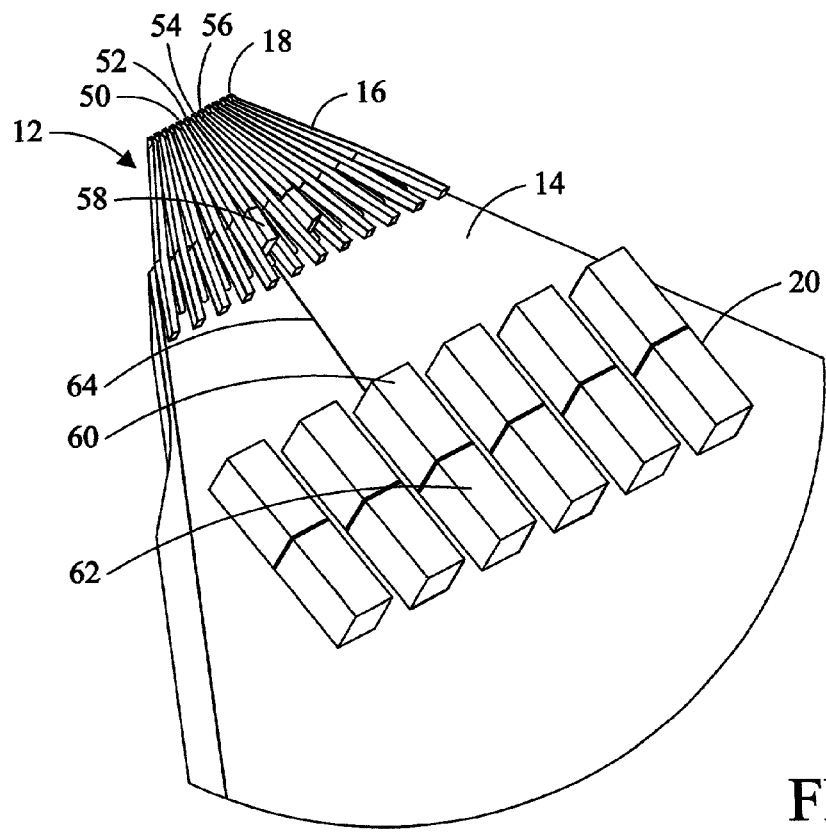
FIG. 2 shows a bottom view, at an enlarged scale, of the probe head of FIG. 1.

FIGS. 1 and 2 illustrate an exemplary wafer probe 10. The wafer probe 10 includes an integrated tip assembly 12 mounted to a circuit board 14. The integrated tip assembly 12 comprises a plurality of contact fingers 16 extending from the circuit board 14 in a radially inward direction so as to match the compact geometry of the device under test (not shown). The distal end portion 17 of each contact finger is shaped to provide a reliable electrical connection with an associated pad on a device under test. The circuit board 14 has electrical traces that route signals from the contact fingers 16 through a resistor-capacitor (RC) network 20 to pin connectors 22. Measurement cables (not shown) may be electrically connected to the pin connectors.

The wafer probe 10 is designed to be mounted on a support through a three hole mounting frame 24 of a wafer probe station so as to be in a suitable position for probing a device under test, such as an individual component on a semiconductor wafer. In this type of application, the wafer is typically supported under vacuum pressure on the upper surface of a chuck that is part of the same probing station. Ordinarily an X-Y-Z positioning mechanism is provided, such as a micrometer knob assembly, to effect movement between the supporting member and the chuck so that the tip assembly of the wafer probe can be brought into pressing engagement with the contact pads of the device under test.

Figure 3:
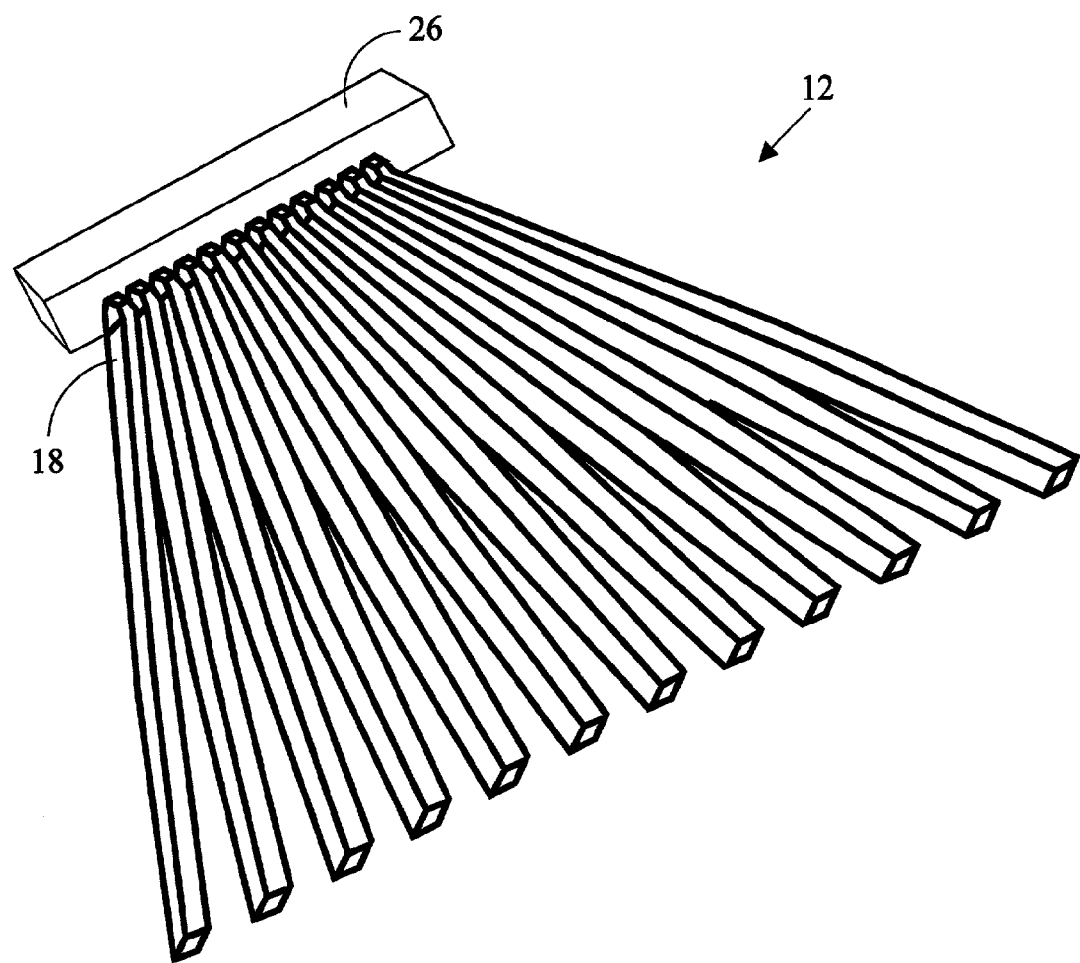
FIG. 3 shows an enlarged view of the probe tips attached to a common carrying tab of the probe head of FIG. 1.

Referring to FIG. 3, the integrated tip assembly 12 is fashioned as a unitary device with the individual contact fingers 16 connected by a common carrying tab 26 at the probing end. Each individual contact finger 16 is positioned so that, after the integrated tip assembly 12 is attached the circuit board 14, the common carrying tab 26 may be severed, leaving the distal end 18 of each contact finger in the appropriate position for probing the contact pads of the device under test.

The spacing of the contact fingers 16 at their respective distal ends 18 is selected to match the geometry of the DUT pads. Use of an integrated tip assembly 12 advantageously serves to maintain this proper spacing while the contact fingers 16 are attached to their respective connections to the circuit board 14. Typically, contact fingers or needles are attached to a circuit board by being held flush to their respective traces and soldered into the appropriate position and pitch. During this process, lateral forces tend to displace the distal ends of the contact fingers, making it difficult to maintain the proper spatial relationship between the contact fingers to match that of the pads of the DUT. Use of a carrying tab 26, however, maintains the proper transverse spacing of the distal ends 18 of the contact fingers 16 by counteracting any lateral forces encountered in the attachment process.

In addition, the probe 16 described herein achieves an improved spatial transformation between the compact geometry of the microelectronic device being probed and the dispersed geometry of the testing equipment and, if provided, any power bypass circuitry. This improved spatial characteristic stands in contrast to earlier design, in which signals were routed through a coaxial cable. A coaxial cable, having simply an inner and an outer conductor, limits the number of attached contact fingers to three, arranged in a ground-signal-ground arrangement. Accordingly, any common carrying tab used to hold the contact fingers in position during their attachment to a coaxial cable also is limited to a maximum of three contact fingers.

Oftentimes, however, the DUT has more than three pads to be tested. In such a case, configuring the probe requires the use of multiple coaxial cables arranged in an adjacent relationship to each other, usually an awkward process given the limited space available near the probe tips. Use of multiple coaxial cables is also problematical in that different cables have differing flexibility, making it difficult to line up all the cables in a single plane and leading to uneven probe forces when the contact fingers are pressed to their respective pads. Moreover, the used of multiple coaxial cables and multiple carrying tabs necessitates the careful and time consuming adjustment of the relative position between the sets of contact fingers to the geometry of the pads of the DUT. In another design, the use of multiple coaxial cables and a single carrying tab necessitates the careful and time consuming adjustment of the relative position of the coaxial cables.

Use of a circuit board 14, however, addresses each of these drawbacks. Because the circuit board 14 can include separate traces for each of the contact pads of the DUT to which the probe will be engaged during testing, the common carrying tab 26 depicted in FIG. 3 may include four or more contact fingers 16, maintaining all of their respective distal ends in their proper position until each finger 16 is rigidly attached to the circuit board 14. The circuit board 14 provides a controlled and uniform flexure, assuring not only a uniform amount of overtravel when the fingers 16 make contact with the pads of the DUT, but also a mechanism by which the stress in the contact fingers 16 may be relieved by the uniform flexibility of the circuit board 14. This flexibility may even be controlled by the selection of material for the circuit board 14.

FIG. 3 shows an example of an integrated tip assembly having the common carrying tab 26 still attached. The fingers 16 are generally of rectangular cross section and are preferably composed of the same material, where the material is selected from those metals that are capable of high resiliency to enable the fingers to probe a device having associated contact surfaces that are in non-planar arrangement. In the preferred embodiment, the fingers are formed of beryllium-copper (BeCu) which has been gold plated in order to reduce resistive losses. This material is particularly suited for the probing of contact pads that are formed of gold, since BeCu is substantially harder than gold. This, in turn, results in minimal wear and a long, maintenance free period of operation of the probe.

If the pads of the device are formed of aluminum instead of gold, it is preferable to use a harder material for the fingers 16, such as tungsten. Here again, the finger material selected is substantially harder than the contact pad material in order to ensure minimal wearing of the fingers 16. If tungsten fingers are used, it is preferable that they also be gold plated to reduce resistive losses. Use of materials such as BeCu and tungsten allows repeated use of the probe while avoiding the fragility encountered through the use of the ceramic contact fingers described earlier. It should also be noted that other potential materials may be used, in addition to BeCu or tungsten. In addition, a number of other potential techniques exist to connect the contact fingers with the circuit board besides soldering, including epoxy and the like.

The contact fingers 16 are fabricated as a single, integrated unit attached to a common carrying tab 26 at the distal (tip) ends 18. The distal end 18 has a shape that provides a geometrical fanning of the contacts from the very small pitch (center-to center contact spacing) at the distal ends 18 up to the larger geometry of the traces 40 on the circuit board 14.

In accordance with one preferred assembly method, to prepare for connection of the respective contact fingers to the circuit board, solder paste is evenly applied to the exposed traces on the circuit board. The fingers are then held just above their corresponding traces, then lowered until they press against the solder paste in an appropriate position. When the solder is melted, preferably by heating elements arranged above and below the connection region a solder fillet is desirably formed between each finger and its corresponding circuit board trace.

Preferably, while heating the solder, the fingers are held at a slight downward incline relative to the distal ends so that during cooling, each finger assumes a planar relationship with the circuit board 14. During this connection process, it will be noted that the proper transverse spacing is maintained between the respective fingers by the common carrier tab since any forces that would tend to laterally displace the fingers are negated by the common carrier tab 26 that holds the contact fingers at their respective distal ends. 18

After the fingers 16 are attached to the circuit board 14, the common carrier tab 26 is severed as it is no longer needed because proper finger alignment is maintained by the circuit board 14. The fingers 16 are preferably shaped using grinding and lapping processes to create a flat contact area whose leading edge is visible when viewed from directly above.

Figure 4A:
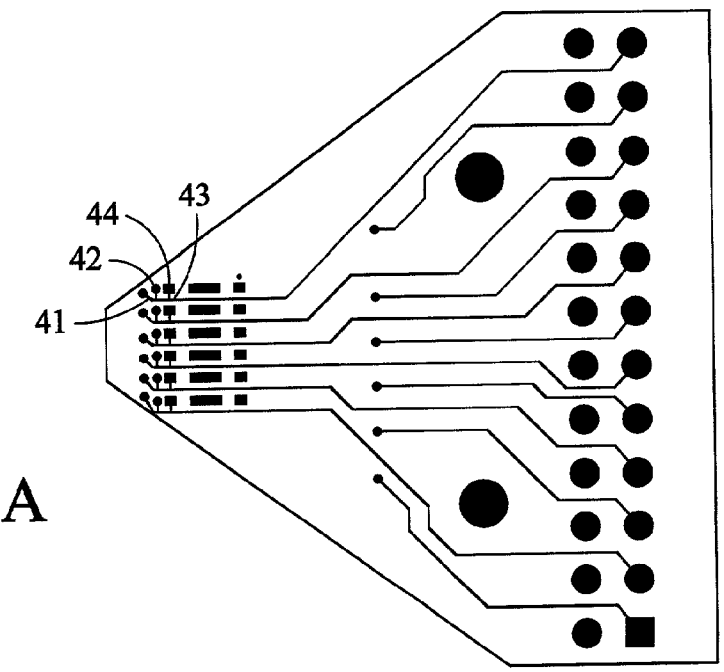
FIG. 4A shows a schematic of the electrical trace patterns of the top face of the exemplary probe head of FIG. 1 including a power bypass feature.
Figure 4B:
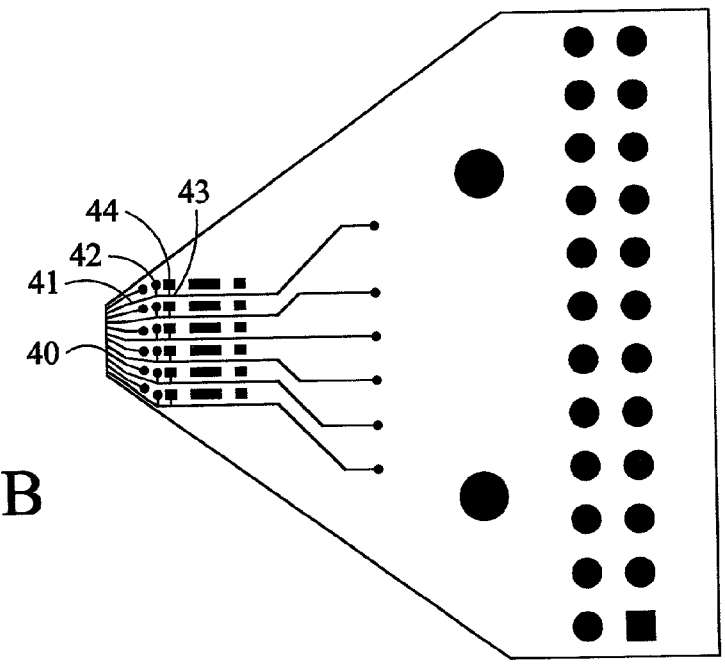
FIG. 4B shows a schematic of the electrical trace patterns of the bottom face of the exemplary probe head of FIG. 1 including a power bypass feature.

Referring to FIG. 1 and FIGS. 4A and 4B, the circuit board electrical traces 40 provide continued geometrical fanning to even larger dimensions, ultimately leading to one or more connectors such as the set of pins shown in FIG. 1, typically of a much larger physical scale. The circuit board 14 may have a ground plane (not shown) providing reduced ground inductance and controlled impedance of the signal traces 40—usually 50 ohms for use with standard test equipment. Use of a circuit board 14 also allows for the optional use of very small dimension Surface Mount Technology (SMT) components that can be placed at an intermediate level of geometric scaling.

As shown in FIG. 1 and FIG. 2, the structure is compatible with a power bypass architecture that can be mounted on the surface of the circuit board 14. In the preferred embodiment both surfaces of the circuit board are used to provide the power bypass feature in order to utilize the additional space.

To illustrate how such a power bypass structure may be incorporated, FIGS. 1 and 2 depict a power bypass architecture spread over both surfaces of the circuit board 14. It should be noted, however, that it is entirely feasible to provide a complete power bypass structure using only one surface of the circuit board if so desired. In this illustration, the four contact fingers 50, 52, 54, 56 are arranged in an adjacent relationship, alternating between power and ground contacts. On the bottom surface of the circuit board, depicted FIG. 2, a high frequency metal-insulator-metal (MIM) capacitor is attached between the adjacent power and ground transmission lines formed by respected pairs of contact fingers.

While the MIM capacitor has very low inductive parasitics and a very high self-resonant frequency it does not have very much capacitance. This limits its ability to provide power bypass at lower frequencies. Accordingly, a relatively larger sized and valued SMT capacitor, though still of very small physically dimension, is placed further up the board where there is sufficient space. A small value SMT resistor is used in series with this capacitor to "de-Q" or spoil the parallel resonance that can occur between the MIM capacitor and the inductance of the line length running to the SMT capacitor.

Referring specifically to FIGS. 4A and 4B, the circuit board is designed to allow customization of the function, i.e. ground, signal, power, etc., of each electrical contact of the probe. Initially, each of the fingers is connected to a via to the ground plane, to an SMT component and eventually to the connector. Programming a ground contact requires simply leaving the connection to the ground intact, while for all other functions this small circuit board trace is cut away, with a sharp blade or a laser for instance. When programming a bypassed power line the connection to the SMT component is left intact while the short circuit trace to the ground is cut.

Referring again to FIG. 1, the probe design preferably includes an inclined circuit board 14 relative to the device under test. A major portion of the fingers 16 are likewise preferably aligned with the plane of the circuit board 14 with the distal ends 18 being shaped for appropriate probing of the device under test. This inclined design permits the circuit board 14 to be spaced apart from the device under test during testing, while simultaneously permitting the fingers 16 to be short, which minimizes inductance to increase performance. Otherwise, the fingers would need to be mounted in an inclined manner with respect to the circuit board, which in many cases, would require longer fingers for effective probing.

The invention claimed is:

1. A probe comprising:
   (a) a substantially rigid support base;
   (b) a substantially and uniformly flexible circuit board attached and inclined with respect to said support base, wherein said circuit board includes a resistor-capacitor network comprising a first set of capacitors connected between adjacent power and ground transmission lines, and a second set of capacitors are not adjacent said power and ground transmission lines connected respectively to said first set of capacitors;
   (c) an integrated tip assembly comprising a plurality of contact fingers supported by and extending from said circuit board, wherein said contact fingers are interconnected with said circuit board and are arranged as a unity assembly, wherein said plurality of contact fingers are maintained in a predetermined alignment when attached to said support by a tab proximate the ends of said plurality of contact fingers.

2. The probe of claim 1 wherein a plurality of said contact fingers extend in a radially outward direction from said base.

3. The probe of claim 2 wherein the arrangement of said contact fingers match the geometry of e contacting pads on a device under test.

4. The probe of claim 1 wherein said unitary assembly includes a tab proximate the ends of said plurality of contact fingers that maintains said contact fingers in said predetermined alignment.

5. The probe of claim 4 wherein said tab is removed prior to probing with said contact fingers.

6. The probe of claim 1 wherein said circuit board includes a respective trace for each of said contact fingers.

7. The probe of claim 6 wherein said respective traces are electrically interconnected to a connector suitable to interconnect to test equipment.

8. The probe of claim 5 wherein said removal of said tab leaves the ends of each of said plurality of contact fingers in a predetermined position.

9. The probe of claim 1 wherein said plurality of contact fingers is greater than three.

* * * * *